United States Patent [19]
Kristof et al.

[11] 4,065,664
[45] Dec. 27, 1977

[54] FLOATING POINT REGISTERS FOR PROGRAMMED DIGITAL INSTRUMENTS

[75] Inventors: Paul J. Kristof; Frederick A. Rose, both of Fort Atkinson, Wis.

[73] Assignee: Norland Corporation, Fort Atkinson, Wis.

[21] Appl. No.: 670,722

[22] Filed: Mar. 26, 1976

[51] Int. Cl.² .................... H01J 29/70; G01R 23/16
[52] U.S. Cl. ............................. 364/487; 324/121 R; 324/77 R
[58] Field of Search ............... 235/151.3, 151.31, 151, 235/150; 340/172.5, 324 A, 324 AD; 444/1; 324/77 R, 77 A, 77 B, 121 R

[56] References Cited

U.S. PATENT DOCUMENTS

| | | | |
|---|---|---|---|
| 3,317,717 | 5/1967 | Schumann | 235/151 X |
| 3,539,726 | 11/1970 | Bolie | 324/77 R X |
| 3,544,894 | 12/1970 | Hartwell et al. | 324/77 R |
| 3,548,305 | 12/1970 | Kaufman | 324/77 R |
| 3,653,027 | 3/1972 | Scheer | 324/121 R X |
| 3,753,105 | 8/1973 | Harzer | 324/121 R |
| 3,790,767 | 2/1974 | Alexander | 235/151.31 |
| 3,836,851 | 9/1974 | Schumann | 324/121 R X |
| 3,872,461 | 3/1975 | Jarosik et al. | 324/121 R X |
| 3,879,661 | 4/1975 | Collins | 324/77 B |
| 3,882,446 | 5/1975 | Brittian et al. | 340/324 A X |

OTHER PUBLICATIONS

Built-in Microprocessor Available in Scope, Electronic Design 20, Sept. 27, 1974, p. 25.

*Primary Examiner*—Edward J. Wise
*Attorney, Agent, or Firm*—Andrus, Sceales, Starke & Sawall

[57] ABSTRACT

A waveform measuring and analyzing instrument includes a digital memory unit which stores the waveform data as a fixed point number. The waveform is typically digitized as an eight or ten bit number and stored in a slightly wider array of memory locations, typically twelve bits wide. A block multiplier register and a block offset register store floating point numbers, typically thirty-two bits wide. Each register stores a number common to all data locations in memory, such that the variable or most significant character of the data is now represented over the maximum width of the memory data word. A processor applies the modifying offset and multiplier words or numbers to each memory data word whenever the data word is employed in any data reduction and whenever the data word is read for display. The combination of the two floating point modifying or scaling numbers allows use of relatively narrow storage words and the manipulation of the waveform data by the processor without significant loss of precision. The display of the variable portion of data may then be expanded and presented over a maximum scale for meaningful visual presentation. The memory unit is preferably constructed with a plurality of arrays for separate and combined data acquisition and display. In such a system, each array includes a set of the block modifying registers, including a multiplier register and an offset register. Where the individual arrays can be combined to form a new array, one of the register sets for the individual arrays may be assigned as the modifier for the combined array or the individual sets may be used for each array forming the new array.

11 Claims, 4 Drawing Figures

FLOATING POINT REGISTERS FOR PROGRAMMED DIGITAL INSTRUMENTS

BACKGROUND OF THE INVENTION

This invention relates to a waveform measuring instrument having a resident programmed processor and particularly to a waveform memory unit for storage of digitized waveform data and having data modifying register apparatus.

Digital devices are employed in the measurement and analysis of changing physical phenomena which may be of a repetitive or transient nature. Generally, a transducer develops an analog voltage signal in accordance with a sensed physical phenomena. The transduced electrical signal is connected as the input to the digital device which includes means for digitizing the signal, storing such digitized signal in memory and reproducing a replica of the analog signal from which such digitized data. Various modes of signal acquisition and presentation are provided in recently developed digital devices.

A particularly satisfactory and improved waveform measuring and analyzing instrument incorporating all the characteristics of digital oscilloscopes and transient recorders and in addition unique signal processing capability is disclosed in the copending application of Frederick A. Rose entitled "WAVEFORM MEASURING MEANS WITH RESIDENT PROGRAMMED PROCESSOR FOR CONTROLLED WAVEFORM DISPLAY AND WAVEFORM DATA REDUCTION AND CALCULATION" filed on Mar. 26, 1976 bearing Ser. No. 670,703 and assigned to the same assignee. As more fully disclosed therein, a resident programmed processor in the instrument permits the user to execute various calculations upon the waveform data stored in a digital memory unit.

A digital memory unit generally includes a plurality of words of a selected bit width. The memory unit of a general purpose computer generally is a wide word memory with the data stored in floating point form. In waveform instruments of the prior art, relatively narrow word memories are employed with the data stored in fixed point form. A single modifying value may be provided as a multiplier. For example, a block multiplier register can be associated with the digital memory unit in waveform instruments and applied as an exponent to a block of the memory locations.

In the programmed processor based instrument of the above-identified application, the waveform data memory unit is a random access memory. For purposes of economy and compactness, the size of the waveform data memory unit is limited and a relatively narrow storage word used as a fixed point number is preferably employed for each data location. Where the waveform includes a large constant value, a great number of word bits are necessary to record such constant and the variable value is spread over a very few number of bits. Further, the resident calculation upon the waveform data, which occurs many times in conventional waveform analysis, may result in a loss of precision in the waveform data as the stored data is appropriately modified and remodified and then again stored in memory.

SUMMARY OF THE PRESENT INVENTION

The present invention is directed to a digital instrument having a digital waveform memory unit in which the data is represented by relatively narrow storage words in combination with a plurality of different modifying register means, each of which is equally applicable to all data words within the memory unit. More particularly, in accordance with this invention, the multiple modifying register means includes an offset register means and a multiplier register means which permit the offsetting and the scaling of the stored number to form a number meaningful to the user. The variable or most significant character of the data is represented over the maximum width of the data word. The processor applies the modifying offset and multiplier words or numbers to each data word whenever the data word is employed in any data reduction and whenever the data word is read for display. The combination of the two scaling numbers allows the use of relatively narrow storage words but still allows manipulation of the waveform data by the processor without undue loss of precision. The display of the data is correspondingly distributed and presented over a maximum scale for visual presentation.

In the preferred embodiment of a waveform measuring and analyzing instrument, the digital memory unit stores the data as a fixed point number in a relatively narrow word, typically twelve bits wide. The waveform data may be digitized as eight or ten bit words, with the extra bits in memory used to store extra precision as a result of calculations on the waveform data. The block multiplier register means and block offset register means are floating point numbers, typically thirty-two bits wide. This has been found to provide a practical and economical construction.

In a waveform measuring and analyzing instrument, the memory unit is preferably constructed with a plurality of arrays for separate and combined data acquisition and display, such as more fully disclosed in the copending application entitled "RANDOM ACCESS MEMORY APPARATUS FOR A WAVEFORM MEASURING APPARATUS", of Steven R. Smith and Frederick A. Rose, which was filed on Mar. 26, 1976, bearing Ser. No. 670,890 and is assigned to the same assignee. In accordance with this invention, each array includes a set of the block modifying register means, including a block multiplier register and a block offset register. Where the individual arrays can be combined to form a new array, one of the sets for the individual arrays may be assigned as the modifier for the combined array or the individual sets may be used.

The inventors have found that the present invention provides a simple and economical means for storing data in a limited sized random access memory in such a way that multiple calculations upon such data result in a reduced loss of intelligence and is a particularly satisfactory means for storing digitized waveform data in a waveform measuring and analyzing instrument such as disclosed in the previously identified applications.

BRIEF DESCRIPTION OF THE DRAWINGS

The drawings furnished herewith illustrate the best mode presently contemplated for carrying out the invention and in which the above advantages and features are clearly disclosed as well as others which will be readily understood from the following description of such embodiment.

In the drawings.

DESCRIPTION OF ILLUSTRATED EMBODIMENT

Figure 1:
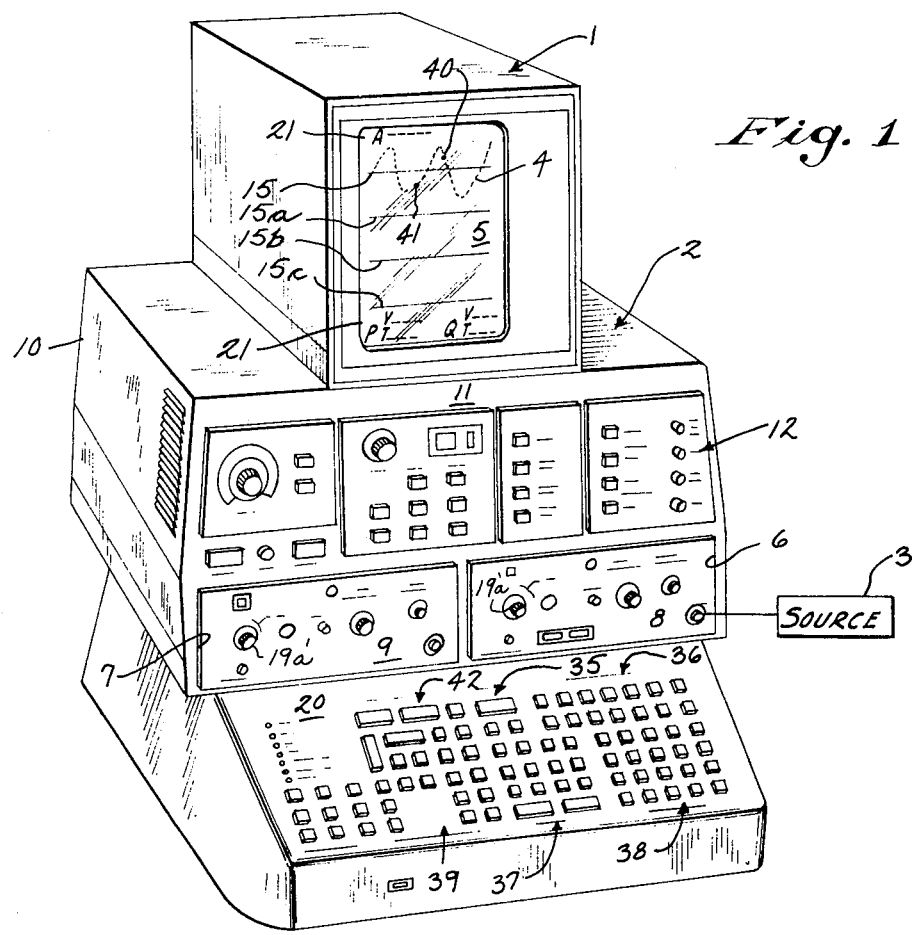
FIG. 1 is a pictorial view of an instrument constructed in accordance with the present invention.
Figure 3:
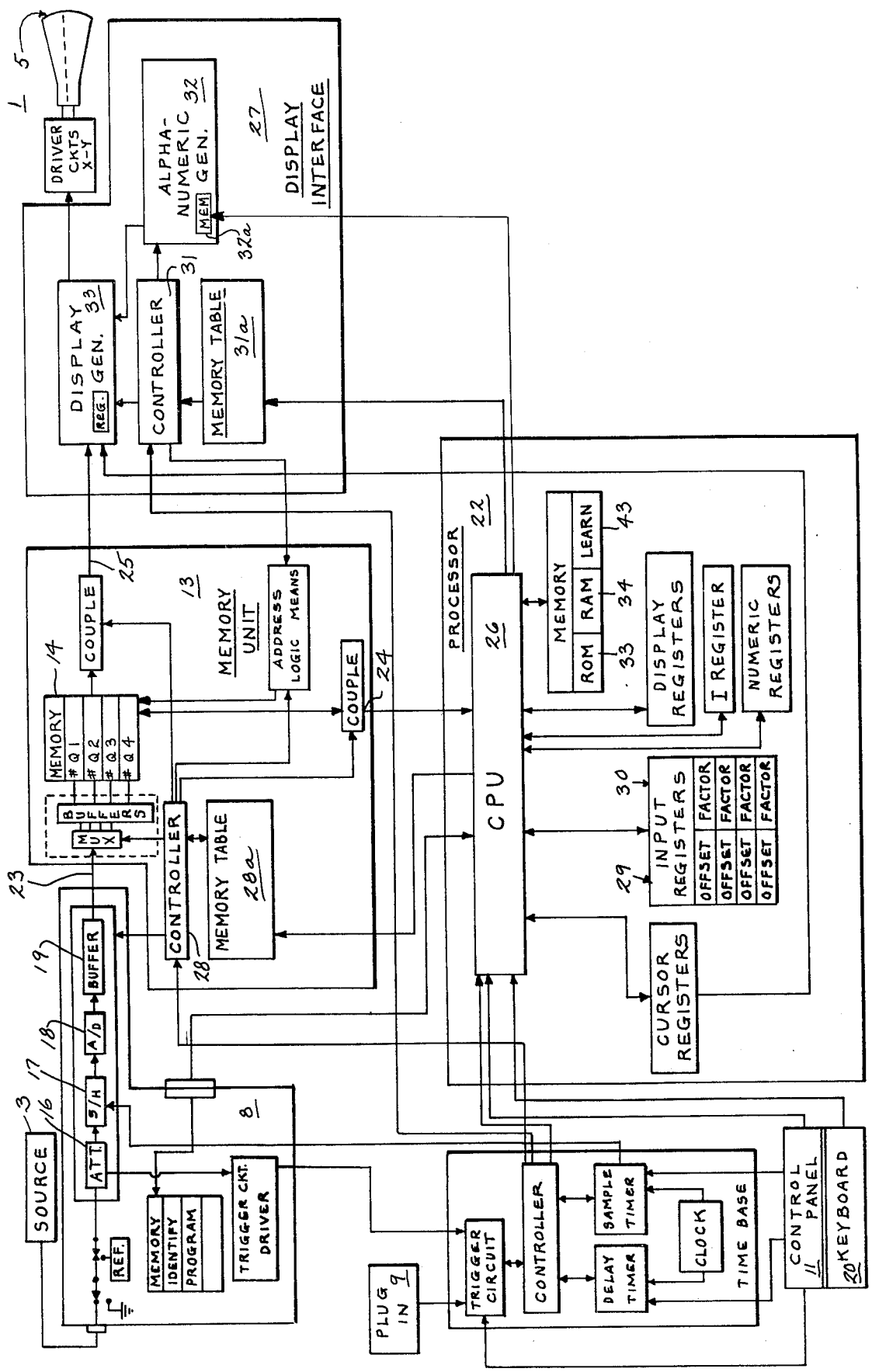
FIG. 3 is a block diagram of a processor for the unit of FIGS. 1 and 2.

Referring to the drawings and particularly to FIG. 1, a pictorial view of a waveform display and analyzing instrument constructed in accordance with the present invention is shown including a visual display unit 1 which is preferably a conventional high speed monitoring CRT oscilloscope. The unit 1 is connected to form an integrated element of a programmable processor unit 2 which is adapted to be connected to a waveform source 3 and drive the CRT unit 1 to display related waveforms 4 on the CRT screen 5, as disclosed in the previously identified copending application. The unit 2 includes a pair of waveform data acquisition receptacles 6 and 7 for receiving data acquisition plug-in units 8 and 9 and permitting the user to tailor the instrument to the user's present and future needs. The unit 2 is conveniently constructed with an upper housing portion 10 with a front control panel 11 including the receptacle openings in the lower portion and with acquisition and display controls 12 in the upper portion. Generally, the upper controls 12 in combination with controls provided in the plug-in units 8 and 9 provide user determined time base and mode of sampling and digitizing. The waveform data is sampled and digitized into a series of digital equivalents which are stored in a digital memory unit 13, shown in FIG. 3. As shown in FIG. 3, the digital memory unit 13 includes a memory blank 14 which includes four equal segments or arrays, with appropriate individual input ports for storing up to four different waveforms, one in each array. The waveforms may be simultaneously displayed on the CRT screen in four vertically spaced quandrants as shown at 15, 15a, 15b and 15c in FIG. 1. The several individual arrays are identified by symbols $Q_1$, $Q_2$, $Q_3$ and $Q_4$ in FIG. 3.

As shown in FIG. 3, input waveform signals are impressed on a signal sampling and digitizing interface circuit in the plug-in unit. The circuit includes an attenuator 16, a sample and hold circuit 17, an analog to digital converter 18 and a coupling buffer register 19 which are interconnected to generate a digital word or number equivalent of a waveform sample. The buffer register 19 is connected to the memory bank 14 and the digitized sample is placed in the memory bank 14. A memory array selection control 19a is provided on the plug-in units 8 and 9 for user selection of the memory array $Q_1 - Q_4$ into which the digitized data word is to be placed.

Figure 2:
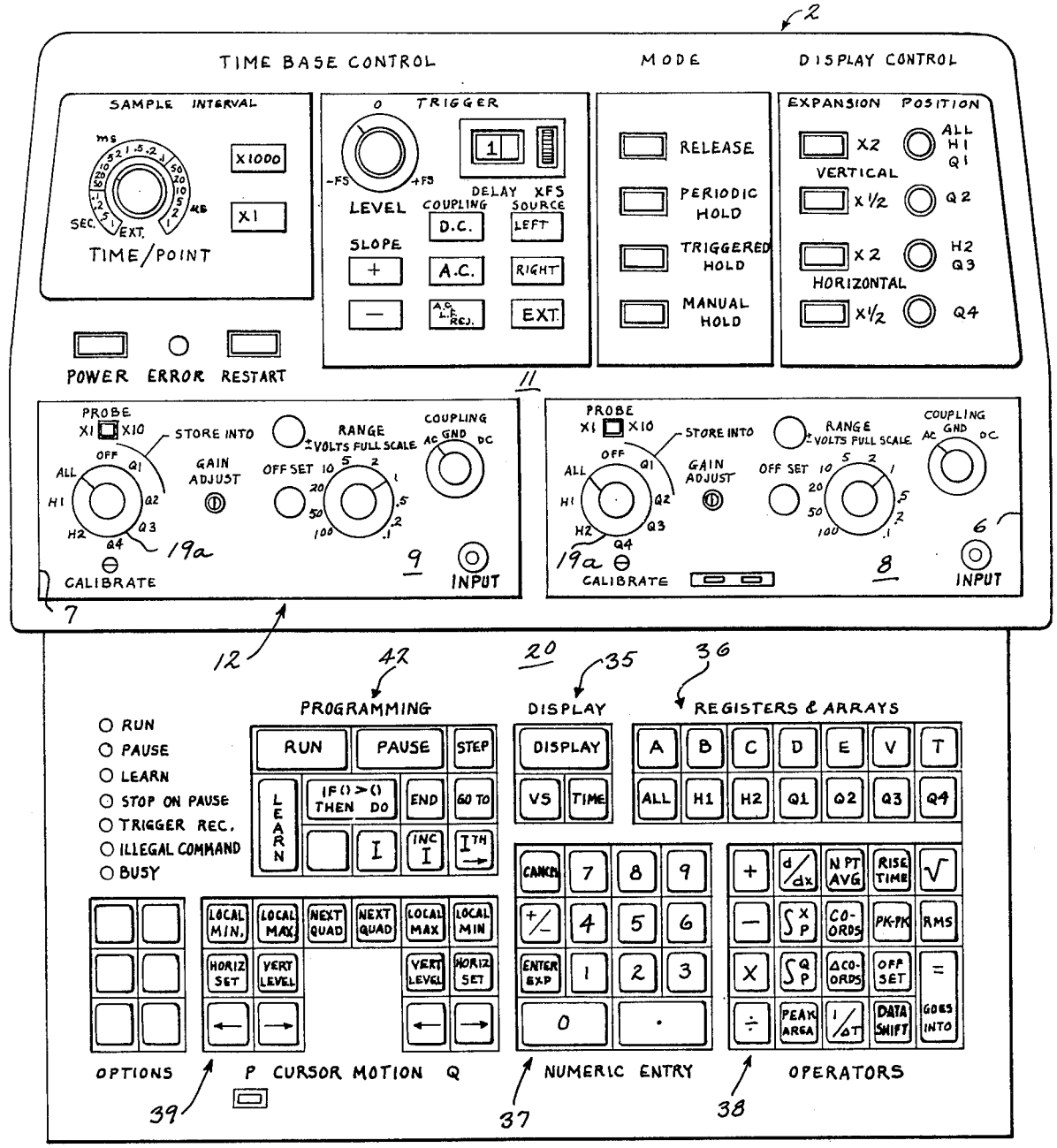
FIG. 2 is a front elevational view of the instrument shown in FIG. 1.

A forwardly extending lower keyboard panel 20 includes a plurality of interactive pre-programmed keys, as more fully shown in FIG. 2, for user operated control. The keyboard 20 provides user selection of the waveform display format and direct user controlled resident data reduction and calculation with respect to the waveform data including display of such data reduction and calculation as at 21 on CRT screen 5.

The user operated keystroke keys of keyboard 20 and the data acquisition and display controls 12 of panels 11 are connected to a processor 22, shown in FIG. 3, for programmed execution of the acquisition and display and of selective data reduction and calculation functions on the waveform data. The calculating keys are provided with indicia which particularly identify the keys by known function symbols for the functions employed in waveform analysis and reduction.

The memory unit 13 and particularly memory bank 14 includes three main ports 23, 24 and 25 which are hardwired to receive and transmit data. Port 23 is a write-only port which is connected to the buffer register of the plug-in units for writing waveform data in memory locations. Port 24 is a read-write port connected to the central processing unit CPU 26 of the processor 22 for communication with the processor and permitting reduction and calculation of the waveform data. The port 25 is a read-only port connected to the display interfacing unit 27.

The illustrated memory unit 13 includes a sequence controller 28 which has a memory table 28a connected to and written by the processor 22 to control the data acquisition routing into memory bank 14. The recording of appropriate modifying data and the mode of sampling and storing the data is selected by the time base and mode controls of section 12 as more fully discussed hereinafter. The sampled data is placed in memory bank 14 in the first time slot or location following that last slot filled with data such that the zero time slot varies with the last input. The memory controller 28 maintains a record of the memory initial or zero time slot in relationship to the physical addresses of the memory bank.

The controller 28 ensures that whenever a particular data location is requested, the proper data sample is read out. A hardwired controller 28 with the processor written table 28a provides a simple and reliable sequencing of the memory unit. If desired, a separate software programmed processor having a read-write memory bank could, of course, be employed. Thus "memory table" is generically used to define any type of control means which can itself be controlled by being set or written by the processor 22.

The digitized samples are stored in the memory array in the "raw" or as captured form and all modification to such data including input modifying data for proper scaling and the like is stored in a plurality of unique registers. In accordance with the illustrated embodiment, a separate set or pair of registers 29 and 30 are provided for each memory array $Q_1 - Q_4$. The processor 22 applies the scaling register numbers to the data in memory 14 at the time of manipulation or display of the values of the stored data, as more fully developed hereinafter.

The display interfacing apparatus similarly includes a sequence controller 31 with a memory table 31a controlling the waveform display format. Table 31a is written by the processor to control the waveform presented in accordance with the user operation of the interactive panels. An alphanumeric generator 32 generates the display of alphanumeric information on the CRT screen 5 in accordance with information written into an internal alphanumeric memory 32a within the generator 32.

Generally, the display unit 1 is preferably the known high speed CRT monitoring oscilloscope which includes an electron beam for illuminating a spot on the screen 5. An intensity control and beam driver 33 provides for visual presentation of the waveform 4 and data 21 on screen 5. In accordance with conventional practice, the beam is positioned on the screen 5 in accordance with the X–Y coordinates defined by the number in the waveform data memory unit 14 and the beam intensity is increased after the beam is properly located. The memory bank 14 defines a separate location in each array for each display point on the X-Y coordinates which can be displayed versus time or versus any corresponding location in a different array.

The processor 22 generally includes the CPU 26 connected to the front control panel 11, to the keyboard panel 20 and to the plug-in receptacles 6 and 7. A program memory 33, which may be a read-only memory, is connected to the CPU by a reading bus and includes the basic program loop for the processor and various programs for the several user operated keys of panels 11 and 20. The CPU 26 also communicates with a scratch pad memory 34 for manipulation and calculation of data as well as with other memory provided in the instrument in relation to waveform data placed in memory 14.

The lower keyboard panel 20 includes a display format key group or section 35 to initiate the display of data and a register-array section 36 for selection of the data to be displayed from the memory bank 14 and related storage registers for storage of processor calculated values and the like. A numeric entry key group or section 37 provides for introduction of conventional decimal numbers into calculation and data reduction, particularly in connection with a command or an operator section 38 for directly commanding execution of selected calculations and reduction of data. Cursor motion control section 39 for selective and unique control of the positioning of a pair of cursors 40 and 41 on screen 5 and "learn" control section 42 for user insertion of a sequence of keystroke inputs into a learn memory 43 are shown.

The unique interactive keyboard and panel, as more fully disclosed in the previously identified application of F. A. Rose, establishes a highly flexible decision-making instrument which is conveniently and readily controlled and operated by technical personnel without requiring special knowledge of computer processing machine language, particularly with the keys producing direct data calculation and reduction of waveform and related data.

The present invention as previously noted is particularly directed to storing the waveform data in memory bank 14 as unmodified digitized samples, with the plurality of block modifying registers 29 and 30 properly scaling the data numbers during the processing of the data. The instrument is, therefore, only described herein as required to fully explain the embodiment of the invention. For a fuller description of the other aspects and features of the illustrated embodiment, reference may be made to the previously identified copending application.

The main data memory bank 14, for example, may include a twelve bit fixed point number for each data location, with N numbers or words for each array $Q_1$-$Q_4$. The data acquisition may, however, be typically eight bits wide which can produce a resolution on the order of one-half of a percent. When the digitized waveform data is employed in calculations, the resulting number may, of course, contain more bits than the original eight bit wide number. If the modified waveform data is to be placed in the waveform memory array, it is advantageous to store as many of the resultant bits as practical. Where successive calculations are performed on data the retention of extra bits reduces the accumulation of round-off and digitization errors. The additional four bits of each memory word in the described embodiment may be filled, therefore, when storing calculated waveform data.

If the stored waveform data includes a large common factor which is included in the fixed point number, the precision of the instrument rapidly decreases because each stored number is required to employ a substantial number of bits to store such common factors. The few remaining bits must then represent the varying factors.

In accordance with the present invention, the pair of scaling registers 29 and 30 are used to separately store the common data factors for each data location in an array as the appropriate combination of all of the desired or necessary offset and/or multiplier numbers. The data number in each memory bank location is, therefore, used to record the amplitude of the variable portion of the waveform in the data array. The registers 29 and 30 are suitable floating point registers which may be typically 32 bits wide. The offset and multiplier factors are each a definite number which are applied to each data number in accordance with the statement:

$$\text{Actual Data} = (M * D) + A$$

where
- D = Fixed point number which represents a fraction between +1 and −1.
- A = Floating point number in Register 29, as an offset
- M = Floating point number in Register 30, as a multiplier.

The processor 22 correspondingly incorporates the scaling numbers or values into the processing of each data location of the appropriate arrays in the waveform memory bank 14 for display and for data reduction and calculations. The pair of floating point registers 29 and 30 permit the storage of the digitized samples in the memory locations to a high degree of precision and maintain the precision even though each piece of data may be involved in many calculations and reductions. Generally, general purpose computing devices have employed wide fixed point words with sufficient memory capacity or a full floating point memory. However, such construction would adversely affect the cost and housing requirements of the present instrument. Waveform instruments have employed narrow fixed point words with a single modifying value as a multiplier. However, the memory unit in the prior art and waveform instrument does not permit optimum storage of the waveform data.

The present invention by use of a plurality of modifiers and particularly as provided by the floating point multiplier register and offset register hardware construction as a pair of unique scaling numbers contributes to construction of a compact and lost cost instrument while maintaining the desired precision.

Figure 4:
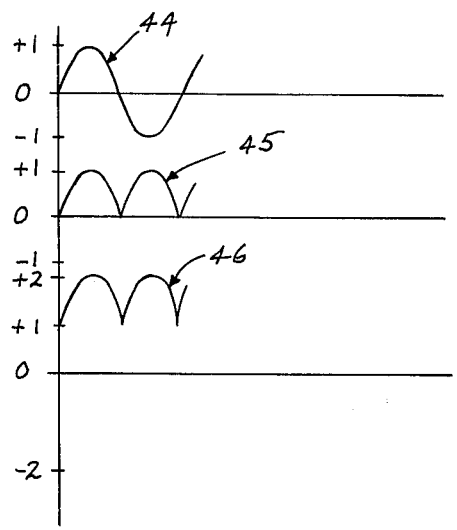
FIG. 4 is a series of an original waveform and reduced waveform derived therefrom.

For example, referring to FIG. 4, a sine wave trace 44 is illustrated. The trace may be stored in the memory bank 14 as a series of digitized samples representing full scale from +1 volts to −1 volts. If the waveform data is squared and stored in the memory array, the resulting waveform trace 45 will result. The variable portion of the waveform data is now all between 0 and +1 volts. Where the data memory value is squared, or otherwise increased, the unused bits of each data memory word, as described above, may be used to record the additional number of bits resulting from the calculation. Any further manipulation of such data retains a higher degree of precision as a result of storing such calculation generated bits. If only a single multiplying modifier is used the twelve bits of the data word remain spread over the two volt range even though the variable portion exists in only one-half of the range. If the squared value is further manipulated, such as being increased by one, the results stored in a memory array of memory 14 and the scale increased to cover −2 to +2 volts, the resulting waveform trace is shown at 46 in FIG. 4. Two bits of the data word are now employed to record the values between −2 and +1, even though no variable data exists within such range. The variable portion of the modified waveform could be spread over the total twelve bits if the common 3 volt factor were removed and treated as an offset.

In the present invention, the offset factor of three volts for the resulting waveform trace 46 would be stored in the offset register 29 and the total number of bits of the data words would be used to record the 1 volt variation. However, if the waveform data in memory is employed in further calculation, or if a point value is to be displayed, the processor 22 adds the value in the offset register 29 to the stored member such that the true value is employed in the calculation or display. Thus, the processor applied both modifying numbers to each data location word in memory. The actual values of the several data locations are therefore always properly recorded and used by the processor. For example, one of the cursors may be located at a desired location, with the value displayed as at 21. The processor 22 processes the stored number at the memory location for the cursor in accordance with the previous mathematical statement and the display 21 is the actual data value.

The four quadrant memory array may be configured as a single array or as half arrays with a digitized waveform placed in the corresponding arrays, as more fully disclosed in the copending application of Steven R. Smith and Frederick A. Rose. The processor 22 may use all of the several sets of registers for the quadrants in the configured array or may place the appropriate offset and multiplier numbers in a single set of the registers 29 and 30 assigned to such combined arrays. For example, the Q1 registers may be used for the full or single array and for a half array consisting of quadrants Q1 and Q2. The Q3 registers may be assigned to the other half array consisting of quadrants Q3 and Q4.

When composite arrays are constructed from a multiplicity of smaller arrays, each of which has associated with it offset and multiplier registers, the composite array may use one of those sets of registers to apply to the entire composite array or, at the expense of more software overhead, may allow the offset and multiplier registers for each subarray to be different. Such a choice of strategy further preserves the precision of the data since each of the individual offset and multiplier factors can be chosen to suit the data only within their respective blocks. An example of the type of data for which this arrangement would be advantageous would be in the representation of an exponential wave.

The present invention thus provides a simple and inexpensive means for storage of digitized data in a limited memory with the precision of the data retained even though operated on a substantial number of times.

Various modes of carrying out the invention are contemplated as being within the scope of the following claims, particularly pointing out and distinctly claiming the subject matter which is regarded as the invention.

We claim:

1. A waveform measuring and analyzing instrument, comprising digital memory means for storage of the coordinates of the waveform in digitized form, a data acquisition means connected to said memory means for establishing digitized waveform signals of a waveform, a programmed processor having a program memory, an interactive user operated control means having a plurality of keystroke means for calculating with data in said memory means, said processor means including a plurality of data modifying registers for each block of said memory means, means for placing modifying values in said registers, said values being common to each location in each block of said memory means, said processor modifying the data in each of said locations in said block by said plurality of registers to create actual values of data.

2. In the instrument of claim 1 wherein said plurality of registers include an offset register and a multiplier register.

3. In the instrument of claim 2 wherein said registers are floating point number registers.

4. In the instrument of claim 1 wherein said memory means stores the data as a fixed point number.

5. In the instrument of claim 4 wherein said registers include an offset register and a multiplier register, said registers being floating point number registers.

6. The instrument of claim 1 wherein said memory means includes numbers on the order of 12 bits for each storage location, and said plurality of registers includes an offset register and a multiplier register, said registers being floating point number registers which are each on the order of 32 bits wide.

7. The waveform measuring and analyzing instrument of claim 1 wherein said memory array means includes a plurality of individual arrays having separate ports for individual and conjoint storage and display of waveforms, each of said arrays having a separate plurality of block modifying register means.

8. The waveform measuring and analyzing instrument of claim 7 wherein each separate plurality of block modifying means includes an offset register and a multiplier register.

9. A waveform measuring and analyzing instrument for capturing waveform data, comprising digitizing means for digitizing waveform data into digitized samples, a digital memory unit coupled to the digitizing means and storing the digitized samples in fixed point data words, an offset register means for storing an offset number for said memory, a multiplying register means for storing a multiplying number for said memory, and readout means for reading said memory words and applying both the offset number and multiplying number to each word to create the actual data value.

10. The waveform measuring and analyzing instrument of claim 9 wherein the means for digitizing the waveform data creates storage words narrower than said memory words, and said readout means including a processor coupled to the memory unit for calculation and reduction of the data in memory, said calculation and reduction producing data words of increased width stored in the memory unit.

11. The waveform measuring and analyzing instrument of claim 9 including a display means, said readout means including a display interfacing means connecting the display means to the memory unit for display of the waveform data employing the actual data values.

* * * * *